(12) United States Patent
Wang et al.

(10) Patent No.: US 11,302,796 B2
(45) Date of Patent: Apr. 12, 2022

(54) METHOD OF FORMING SELF-ALIGNED SOURCE/DRAIN METAL CONTACTS

(71) Applicant: Taiwan Semiconductor Manufacturing Co., Ltd., Hsin-Chu (TW)

(72) Inventors: Pei-Hsun Wang, Kaohsiung (TW); Kuo-Cheng Chiang, Hsinchu County (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 113 days.

(21) Appl. No.: 16/837,883

(22) Filed: Apr. 1, 2020

(65) Prior Publication Data
US 2021/0313448 A1 Oct. 7, 2021

(51) Int. Cl.
*H01L 29/66* (2006.01)
*H01L 29/06* (2006.01)
(Continued)

(52) U.S. Cl.
CPC ...... *H01L 29/66515* (2013.01); *H01L 21/764* (2013.01); *H01L 21/76897* (2013.01);
(Continued)

(58) Field of Classification Search
CPC ..... H01L 21/823431; H01L 21/823821; H01L 21/845; H01L 27/0886; H01L 27/0924; H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 21/823418; H01L 21/823814; H01L 21/02532; H01L 29/0847; H01L 29/161; H01L 29/167; H01L 29/66636; H01L 21/823481;
(Continued)

(56) References Cited

U.S. PATENT DOCUMENTS 8,772,109 B2 7/2014 Colinge
8,785,285 B2 7/2014 Tsai et al.
(Continued)

*Primary Examiner* — Younes Boulghassoul
(74) *Attorney, Agent, or Firm* — Haynes and Boone, LLP

(57) ABSTRACT

The present disclosure provides a method of semiconductor fabrication. The method includes forming a fin protruding from a substrate, the fin having a first sidewall and a second sidewall opposing the first sidewall; forming a sacrificial dielectric layer on the first and second sidewalls and a top surface of the fin; etching the sacrificial dielectric layer to remove the sacrificial dielectric layer from the second sidewall of the fin; forming a recess in the fin; growing an epitaxial source/drain (S/D) feature from the recess, the epitaxial S/D feature having a first sidewall and a second sidewall opposing the first sidewall, wherein the sacrificial dielectric layer covers the first sidewall of the epitaxial S/D feature; recessing the sacrificial dielectric layer, thereby exposing the first sidewall of the epitaxial S/D feature; and forming an S/D contact on the first sidewall of the epitaxial S/D feature.

20 Claims, 14 Drawing Sheets

(51) Int. Cl.
*H01L 29/08* (2006.01)
*H01L 29/417* (2006.01)
*H01L 29/78* (2006.01)
*H01L 21/8238* (2006.01)
*H01L 21/764* (2006.01)
*H01L 21/8234* (2006.01)
*H01L 21/768* (2006.01)
*H01L 27/092* (2006.01)

(52) U.S. Cl.
CPC ............ *H01L 21/823431* (2013.01); *H01L 21/823475* (2013.01); *H01L 21/823814* (2013.01); *H01L 21/823821* (2013.01); *H01L 21/823871* (2013.01); *H01L 21/823878* (2013.01); *H01L 27/0924* (2013.01); *H01L 29/0653* (2013.01); *H01L 29/0847* (2013.01); *H01L 29/41791* (2013.01); *H01L 29/66636* (2013.01); *H01L 29/66795* (2013.01); *H01L 29/7851* (2013.01); *H01L 2029/7858* (2013.01)

(58) Field of Classification Search
CPC ....... H01L 21/823878; H01L 21/76224; H01L 21/6681; H01L 29/0649–0653; H01L 21/764; H01L 21/7682; H01L 29/4991; H01L 29/515
See application file for complete search history.

(56) References Cited

U.S. PATENT DOCUMENTS

| | | | |
|---|---|---|---|
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,455,331 | B1 * | 9/2016 | Cai ..................... H01L 27/0886 |
| 9,520,482 | B1 | 12/2016 | Chang et al. |
| 9,576,814 | B2 | 2/2017 | Wu et al. |
| 9,748,245 | B1 * | 8/2017 | Cheng ................ H01L 29/6681 |
| 10,096,587 | B1 * | 10/2018 | Yu .................... H01L 21/823481 |
| 10,269,932 | B1 * | 4/2019 | Arya ............... H01L 21/823418 |
| 2019/0067417 | A1 * | 2/2019 | Ching ................ H01L 29/0653 |
| 2019/0067445 | A1 * | 2/2019 | Ching ................ H01L 29/6681 |
| 2019/0067446 | A1 * | 2/2019 | Ching ............ H01L 21/823481 |
| 2019/0096765 | A1 * | 3/2019 | Ching ................ H01L 29/0653 |
| 2019/0393096 | A1 * | 12/2019 | Tang ............... H01L 21/823418 |
| 2020/0058649 | A1 * | 2/2020 | Ching ............... H01L 21/31116 |
| 2020/0066718 | A1 * | 2/2020 | Li .................... H01L 21/823418 |
| 2020/0105535 | A1 * | 4/2020 | Lin .................. H01L 21/823431 |
| 2020/0105603 | A1 * | 4/2020 | Chang ............... H01L 21/76895 |
| 2021/0013322 | A1 * | 1/2021 | Xie ................... H01L 21/76224 |

* cited by examiner

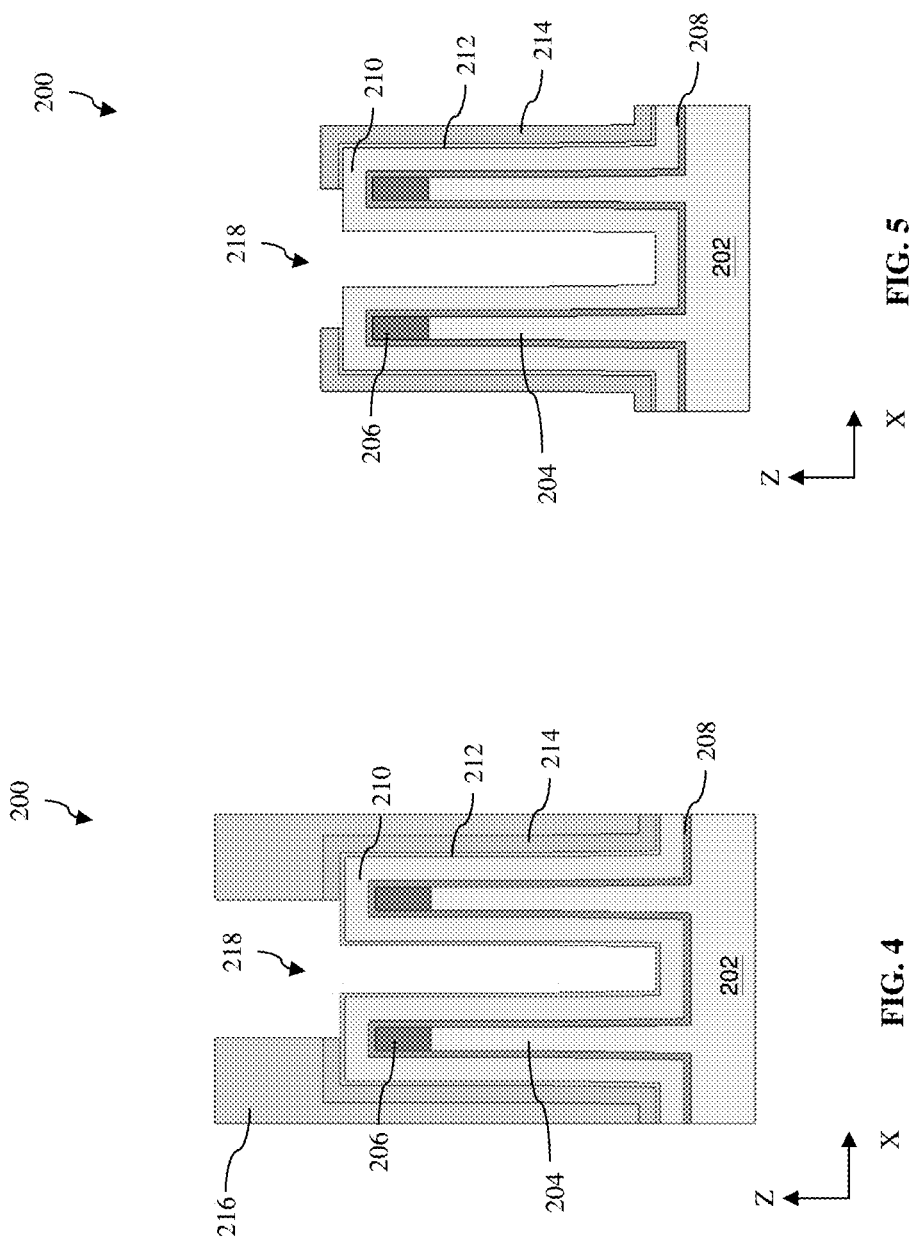

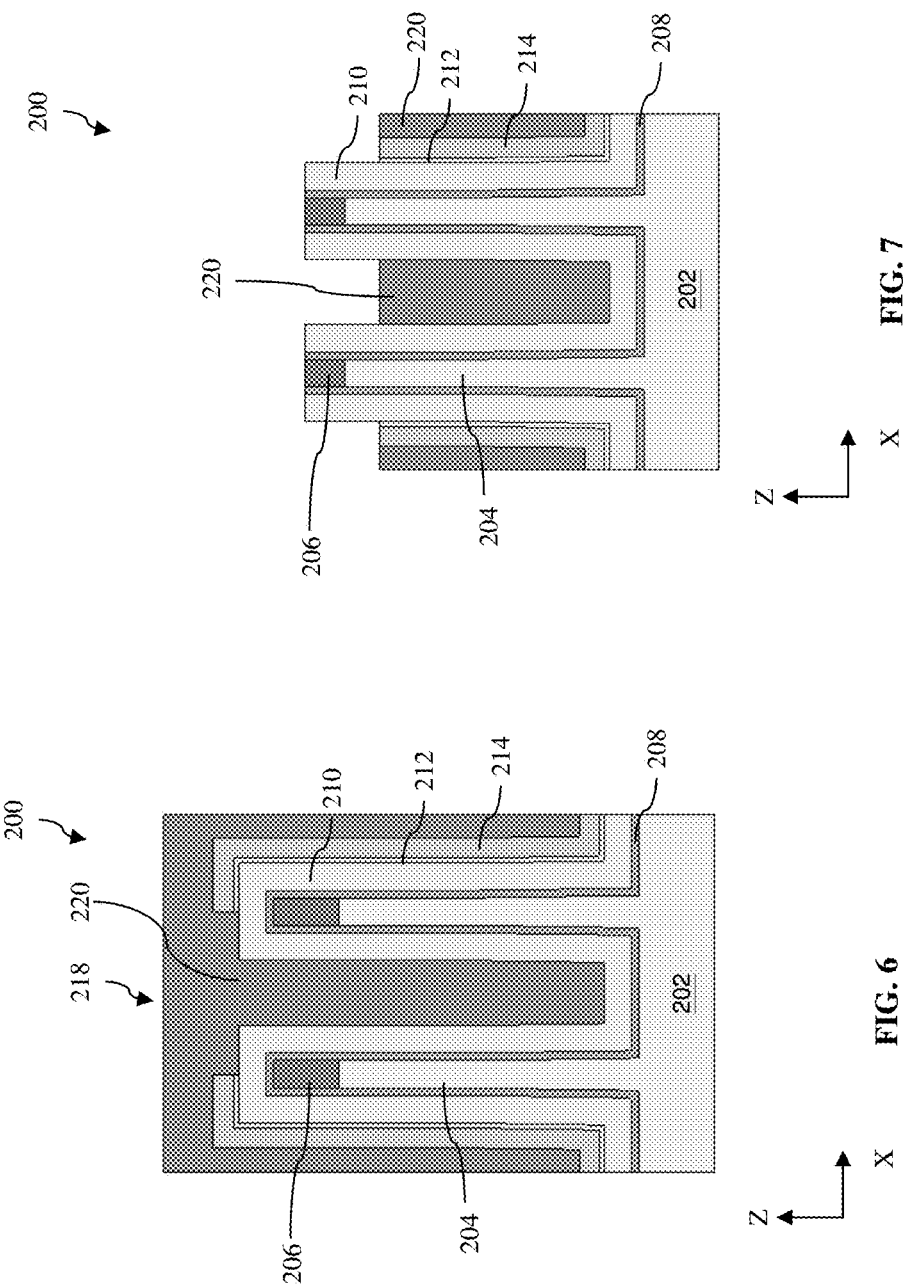

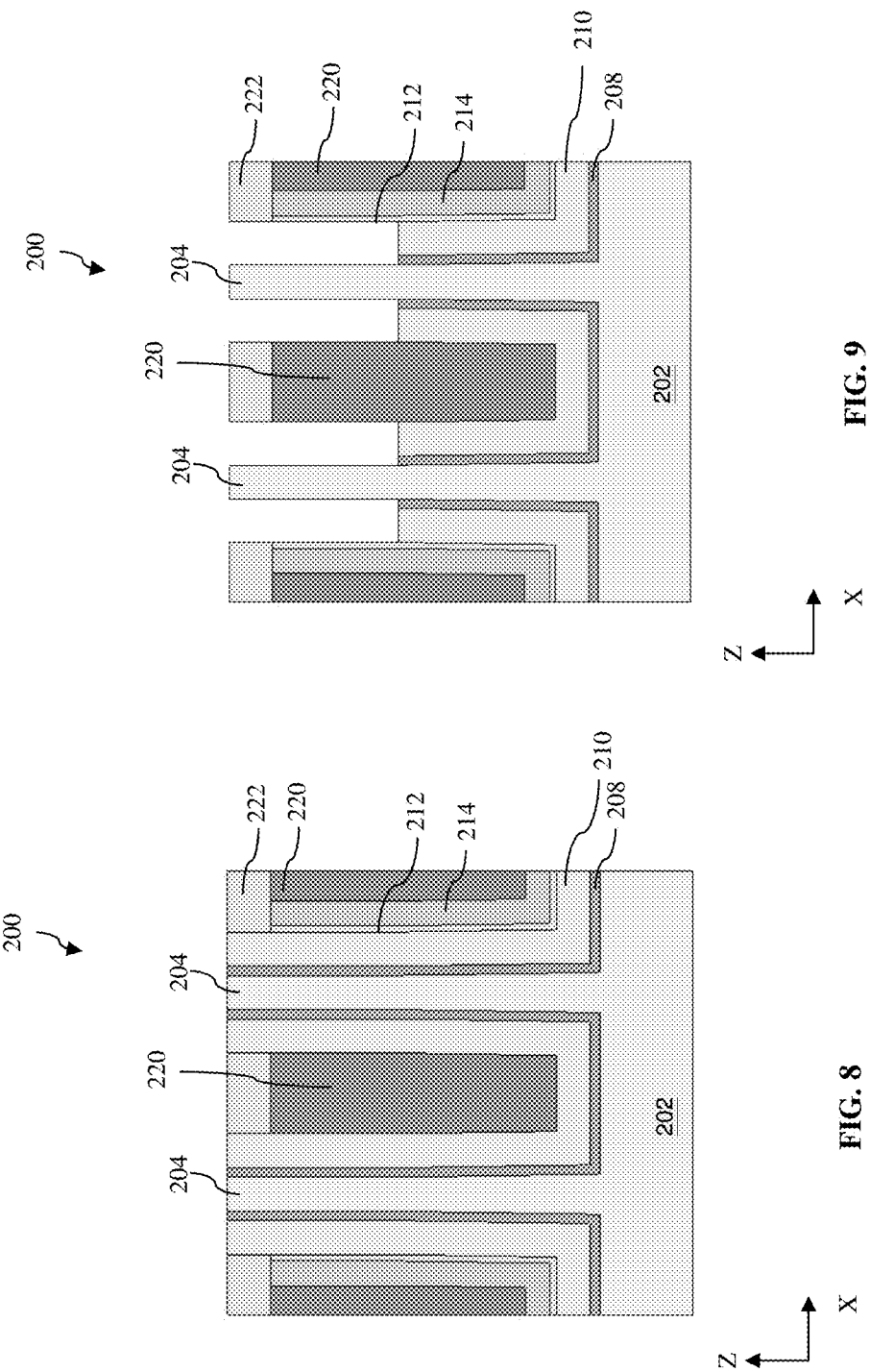

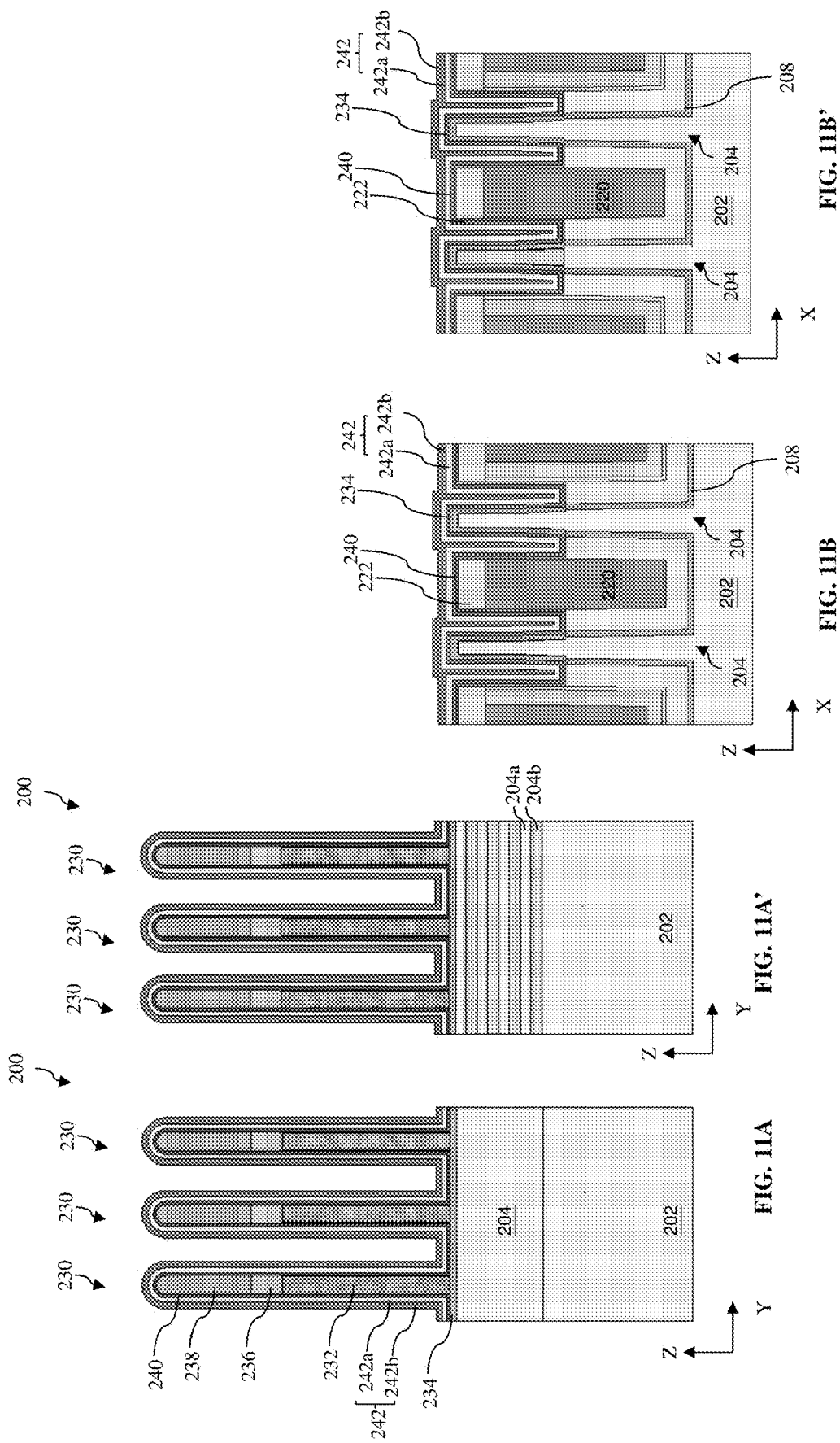

METHOD OF FORMING SELF-ALIGNED SOURCE/DRAIN METAL CONTACTS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, reducing contact resistance between source/drain (S/D) features and S/D metal contacts becomes more challenging when device sizes continue to decrease. Particularly, during S/D metal contact formation, the limited spacing between adjacent S/D regions reduces metal contact landing area and enlarges metal contact resistance, which also deteriorates device integration. Although methods for addressing such a challenge have been generally adequate, they have not been entirely satisfactory in all aspects. An object of the present disclosure seeks to provide further improvements in the formation of S/D metal contacts among others.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, and 9 illustrate cross-sectional views of the semiconductor device taken along a X-direction cut at intermediate stages of an embodiment of the method of FIGS. 1A and 1B in accordance with some embodiments of the present disclosure.

FIGS. 11A, 11A', 12A, 13A, 14A, 15A, 16A, and 17A illustrate cross-sectional views of the semiconductor device taken along a Y-direction cut at intermediate stages of an embodiment of the method of FIGS. 1A and 1B in accordance with some embodiments of the present disclosure.

FIGS. 11B, 11B', 12B, 13B, 14B, 15B, 16B, 17B, and 17B' illustrate cross-sectional views of the semiconductor device taken along a X-direction cut at intermediate stages of an embodiment of the method of FIGS. 1A and 1B in accordance with some embodiments of the present disclosure.

DETAILED DESCRIPTION

Figure 1A:
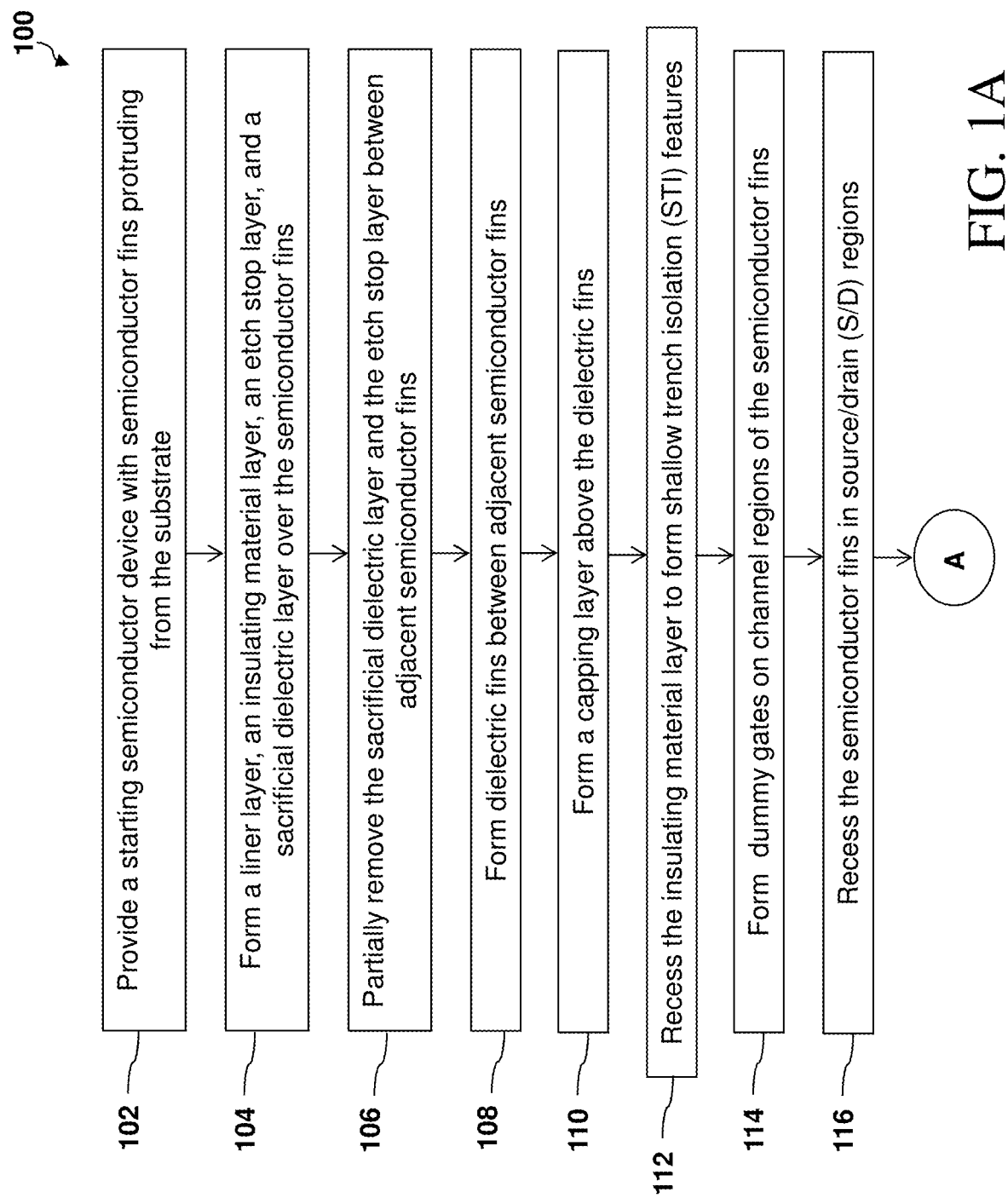
FIGS. 1A and 1B illustrate a flowchart of an example method for making a semiconductor device in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating field-effect transistors (FETs), such as fin-like FETs (FinFETs), gate-all-around FETs (GAA FETs), and/or other FETs.

In semiconductor fabrication, a source/drain (S/D) metal contact (hereafter called an S/D contact) is formed over a top surface of an epitaxial S/D feature after a contact trench (also referred to as contact hole) is formed over the epitaxial S/D feature. As a result, a contact area between the S/D contact and the epitaxial S/D feature may be restricted to only a top portion of the epitaxial S/D feature, which is limited and may result in relatively high contact resistance. One of the improvements in methods of forming a S/D contact is to enlarge the contact trench to expose sidewalls of the epitaxial S/D feature. As a result, the S/D contact formed in the contact trench will have extra contact areas with sidewalls of the epitaxial S/D feature besides the top surface, as if the S/D contact wraps-around three sides of the epitaxial S/D feature. However, with the development of technology nodes, the decreasing spacing between adjacent epitaxial S/D features limits the process window of forming such S/D contacts. For example, during forming of the S/D contact in the contact trench, voids may be formed on sidewalls of the epitaxial S/D feature due to poor filling capability of conductive materials into narrow trenches.

Also, the wrapping portions of the S/D contacts reduce effective spacing between adjacent S/D contacts, which may increase the chance of electric break down when different voltages are applied to adjacent S/D contacts.

The present disclosure provides an S/D contact deposited on a top surface and one sidewall of the epitaxial S/D feature, but not on the other opposing sidewall. The extra contact area on one sidewall of the epitaxial S/D feature reduces contact resistance. Meanwhile, the opposing sidewall of the epitaxial S/D feature is substantially free of contact with the S/D contact, as if the S/D contact half-wraps-around the epitaxial S/D feature, which enlarges the distance between adjacent S/D contacts and improves device break down performance. According to some embodiments, a sacrificial dielectric layer is deposited before the contact trench is formed. During the forming of the contact trench, the sacrificial dielectric layer is partially removed and subsequently replaced by the S/D contact. Accordingly, the sacrificial dielectric layer reserves an area for the S/D contact and the formation of the S/D contact is self-aligned. In addition, by controlling the thickness of the sacrificial dielectric layer, the width of the contact trench is also determined, which can be optimized to facilitate the filling of conductive materials into the contact trench and to avoid the forming of voids on the sidewall of the epitaxial S/D feature.

Figure 1B:
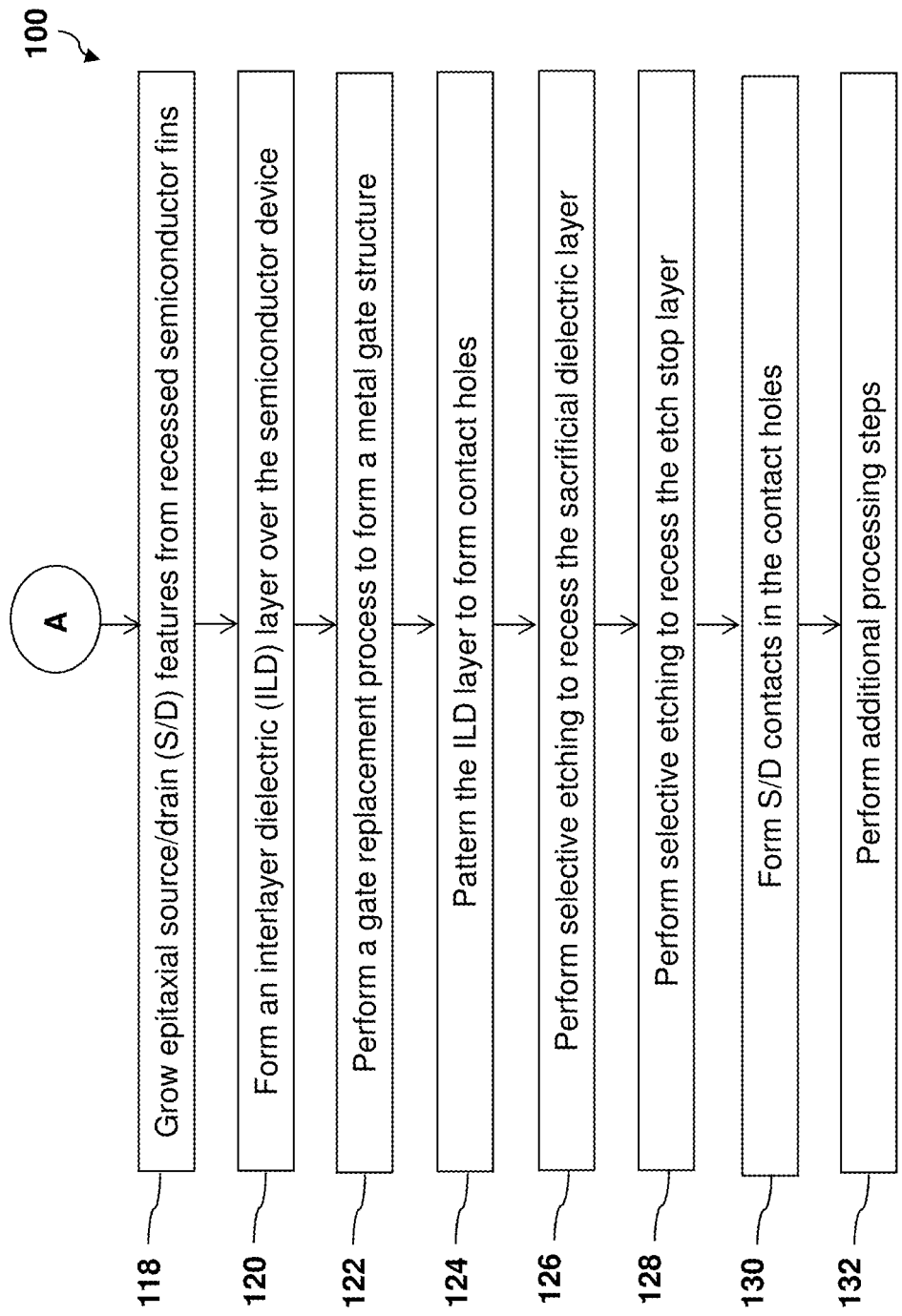
Figure 10B:
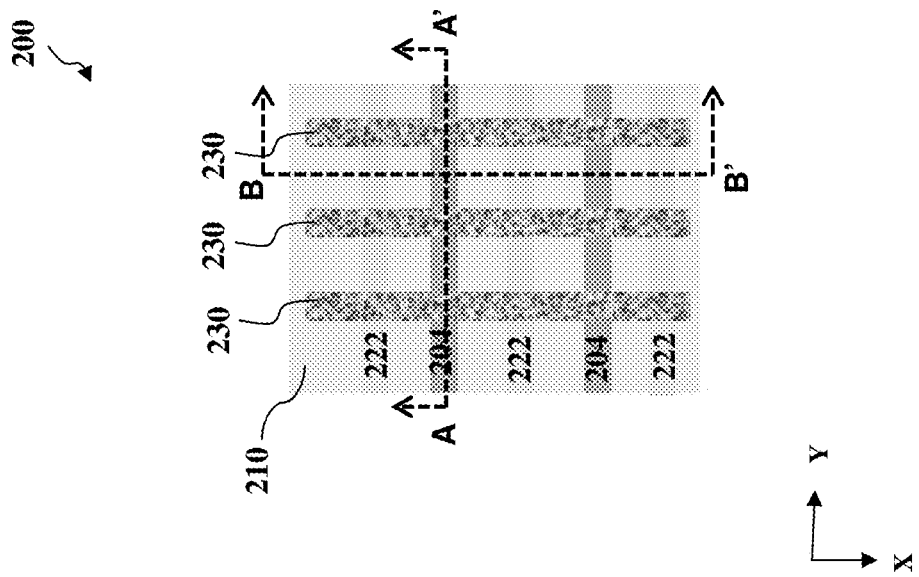
FIG. 10B illustrates a planar top view of an example semiconductor device in accordance with some embodiments of the present disclosure.
Figure 10A:
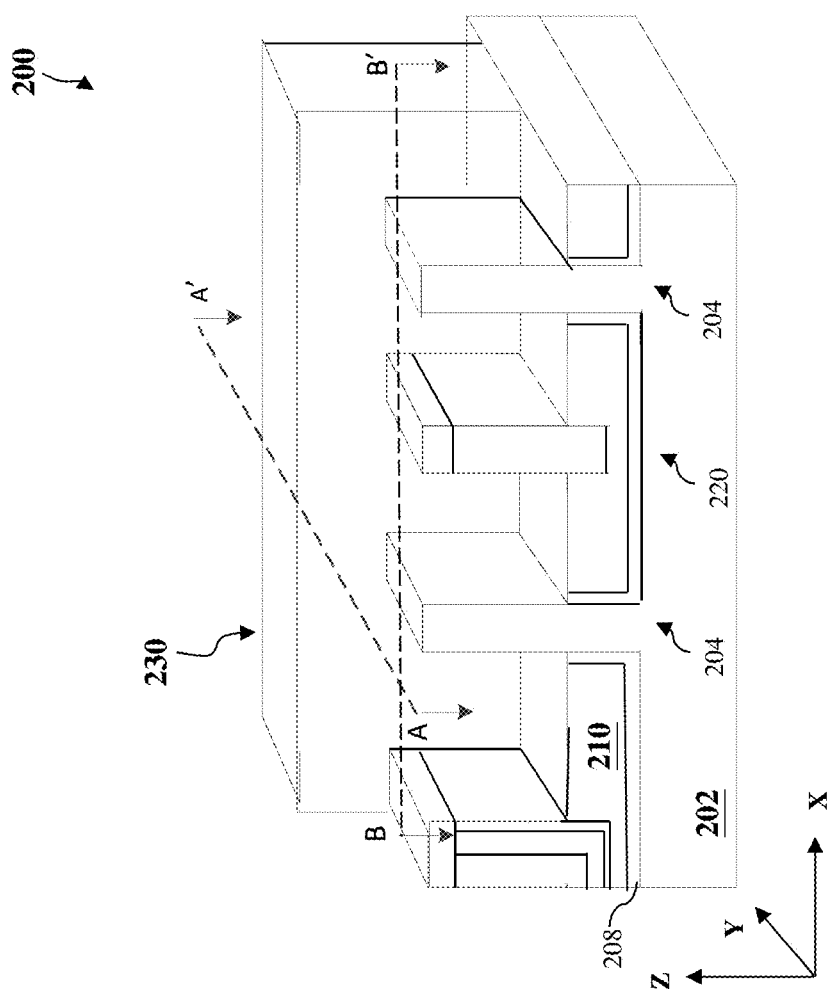
FIG. 10A illustrates a three-dimensional perspective view of an example semiconductor device in accordance with some embodiments of the present disclosure.

FIGS. 1A and 1B illustrates a flow chart of a method 100 for forming a semiconductor device 200 (hereafter called "device 200" in short) in accordance with some embodiments of the present disclosure. The method 100 is merely an example and is not intended to limit the present disclosure beyond what is explicitly recited in the claims. Additional operations can be performed before, during, and after the method 100, and some operations described can be replaced, eliminated, or moved around for additional embodiments of the method. The method 100 is described below in conjunction with other figures, which illustrate various three-dimensional and cross-sectional views of the device 200 during intermediate steps of the method 100. In particular, FIGS. 2, 3, 4, 5, 6, 7, 8, 9, 11B, 11B', 12B, 13B, 14B, 15B, 16B, 17B, and 17B' illustrate cross-sectional views of the device 200 taken along a X-direction cut (that is, along a direction perpendicular to a fin lengthwise direction) in source/drain regions; FIGS. 11B, 11B', 12B, 13B, 14B, 15B, 16B, 17B, and 17B' illustrate cross-sectional views of the device 200 taken along a Y-direction cut (that is, along a fin lengthwise direction); FIG. 10A illustrates a three-dimensional view of the device 200; FIG. 10B illustrates a planar top view of the device 200.

The device 200 may be an intermediate device fabricated during processing of an integrated circuit (IC), or a portion thereof, that may comprise static random-access memory (SRAM) and/or other logic circuits, passive components such as resistors, capacitors, and inductors, and active components such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells The present disclosure is not limited to any particular number of devices or device regions, or to any particular device configurations. For example, though the device 200 as illustrated is a three-dimensional FET device (e.g., a FinFET or a GAA FET), the present disclosure may also provide embodiments for fabricating planar FET devices.

Figure 2:
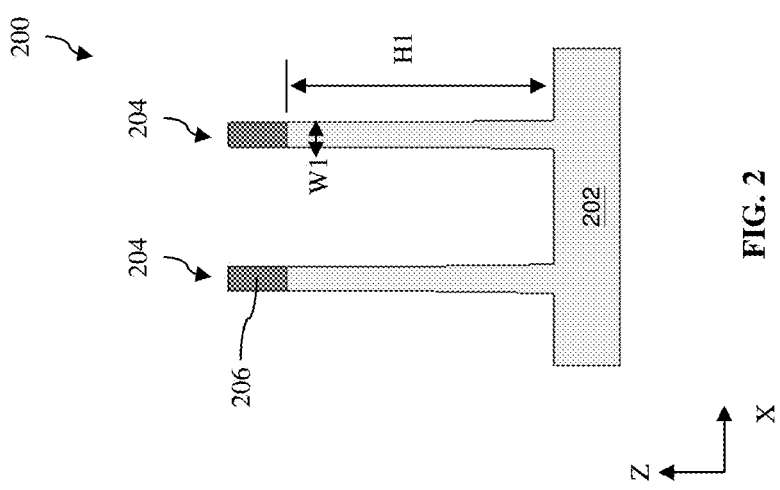

Referring to FIGS. 1A and 2, the method 100 at operation 102 provides the device 200 that includes one or more semiconductor fins 204 protruding from a substrate 202. The substrate 202 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions, such as source/drain regions, are disposed in or on the substrate 202. The doped regions may be doped with p-type dopants, such as phosphorus or arsenic, and/or n-type dopants, such as boron or $BF_2$, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Each semiconductor fin 204 may be suitable for providing an n-type FET or a p-type FET. In some embodiments, the semiconductor fins 204 as illustrated herein may be suitable for providing FinFETs of a similar type, i.e., both n-type or both p-type. Alternatively, they may be suitable for providing FinFETs of opposite types, i.e., an n-type and a p-type. This configuration is for illustrative purposes only and is not intended to be limiting. The semiconductor fins 204 may be fabricated using suitable processes including photolithography and etch processes. The photolithography process may include forming a hard mask layer 206 overlying the substrate 202 and a photoresist layer (resist) overlying the hard mask layer 206, exposing the resist to a pattern, performing post-exposure bake processes, and developing the resist to form a patterned resist layer. The patterned resist layer is then used for transferring the pattern to the hard mask layer 206 in an etching process. The hard mask layer 206 may include a dielectric such as a silicon oxide, a silicon nitride, a silicon oxynitride, and/or a silicon carbide, and in an exemplary embodiment, the hard mask layer 206 includes silicon nitride. Subsequently, the substrate 202 is etched though openings in the pattern of the hard mask layer 206, leaving the semiconductor fins 204 on the substrate 202. The etching processes may include dry etching, wet etching, reactive ion etching (RIE), and/or other suitable processes.

Numerous other embodiments of methods for forming the semiconductor fins 204 may be suitable. For example, the semiconductor fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. In some embodiments, after its formation, the fins 204 have a height $H_1$ along the Z direction between about 40 to about 70 nm and a width $W_1$ of the upper portion of the fins along the X direction between about 10 nm to about 40 nm.

Figure 3:
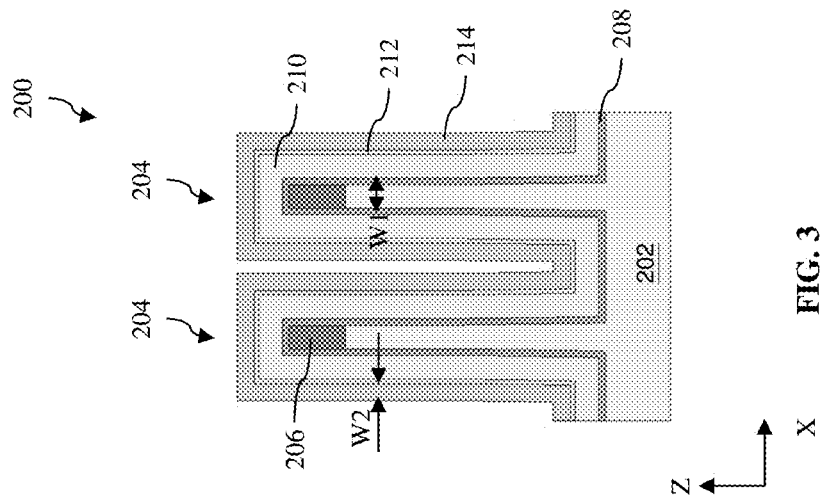

Referring to FIGS. 1A and 3, the method 100 at operation 104 forms a series of dielectric layers over the device 200. In some embodiments, an insulating material layer 210 including one or more layers of insulating material is conformally formed by using CVD, ALD, or other suitable methods. The insulating material layer 210 is deposited in a conformal manner so that it is formed to have substantially equal thicknesses on top surfaces and vertical surfaces, such as the sidewalls, of the semiconductor fins 204, and on horizontal surfaces of the substrate 202. In some embodiments, the insulating material layer 210 is deposited to a thickness in a range from about 10 nm to about 40 nm. The insulating material for the insulating material layer 210 may include silicon oxide, silicon nitride, silicon oxynitride (SiON), SiOCN, SiCN, fluorine-doped silicate glass (FSG), or a low-K dielectric material.

In some embodiments, a liner layer 208 is optionally formed over the device 200 before forming the insulating material layer 210. The liner layer 208 is made of silicon oxide or a silicon nitride-based material (e.g., SiN, SiCN or SiOCN). The liner layer 208 may be first deposited conformally over the semiconductor fins 204 and on the substrate 202 by using CVD, ALD, or other suitable methods. The insulating material for the insulating material layer 210 is then deposited over the liner layer 208.

The method 100 at operation 104 also forms an etch stop layer 212 after forming the insulating material layer 210. The etch stop layer 212 includes a dielectric material different from that of the insulating material layer 210. In some embodiments, the etch stop layer 212 is made of high-k dielectric material (where "high-k" refers to a dielectric constant greater than that of silicon dioxide, which is about 3.9), such as metal oxide (e.g., hafnium oxide, zirconium oxide, aluminum oxide, or a combination thereof). The etch stop layer 212 is conformally formed by using CVD, ALD, or other suitable methods. In some embodiments, the etch stop layer 212 is deposited to a thickness in a range from about 2 nm to about 5 nm.

The method 100 at operation 104 further forms a sacrificial dielectric layer 214 after forming the etch stop layer 212. The sacrificial dielectric layer 214 includes a dielectric material different from that of the etch stop layer 212. In some embodiments, the sacrificial dielectric layer 214 is made of SiOC or SiOCN, or a combination thereof. The sacrificial dielectric layer 214 is conformally formed by using CVD, ALD, or other suitable methods. As will be discussed later on, the sacrificial dielectric layer 214 reserves a space for forming a contact trench exposing sidewalls of epitaxial S/D features grown on the semiconductor fins 204. In various embodiments, the sacrificial dielectric layer 214 is deposited to a width $W_2$ along the X direction between about 15% to about 100% of the width $W_1$ of the semiconductor fins 204, such as about 25%. In various embodiments, when $W_2$ is larger than about 15% of $W_1$, conductive material filling into the contact trench is substantially free of voids despite conductive material's limited gap filling capability in a high aspect ratio trench. On the other hand, when $W_2$ is less than about 15% of $W_1$, voids may be formed in the contact trench, which increases contact resistance between the S/D contacts and the epitaxial S/D features. If $W_2$ is larger than about 100% of $W_1$, spacing between semiconductor fins 204 would have to be increased to accommodate the relatively large width of the sacrificial dielectric layer 214, which would impact the chip size and increase manufacturing cost. In a particular example, the sacrificial dielectric layer 214 is deposited to a width $W_2$ in a range from about 5 nm to about 10 nm.

Referring to FIGS. 1A and 4-5, the method 100 at operation 106 partially remove the sacrificial dielectric layer 214 and the etch stop layer 212 between adjacent semiconductor fins 204 to form a trench 218. Operation 106 may include a variety of processes such as photolithography and etching. The photolithography process may include forming a photoresist layer 216 over the device 200. An exemplary photoresist includes a photosensitive material sensitive to radiation such as UV light, deep ultraviolet (DUV) radiation, and/or EUV radiation. A lithographic exposure is performed on the device 200 that exposes selected regions of the photoresist layer 216 to radiation. The exposure causes a chemical reaction to occur in the exposed regions of the photoresist layer 216. After exposure, a developer is applied to the photoresist layer 216. The developer dissolves or otherwise removes either the exposed regions in the case of a positive resist development process or the unexposed regions in the case of a negative resist development process. Suitable positive developers include TMAH (tetramethyl ammonium hydroxide), KOH, and NaOH, and suitable negative developers include solvents such as n-butyl acetate, ethanol, hexane, benzene, and toluene. After the photoresist layer 216 is developed, the exposed portions of the sacrificial dielectric layer 214 and the etch stop layer 212 may be removed by an etching process, such as wet etching, dry etching, Reactive Ion Etching (RIE), ashing, and/or other etching methods. In some embodiments, the etching process includes multiple etching steps with different etching chemistries, one targeting a particular material of the sacrificial dielectric layer 214 and selected to resist etching the etch stop layer 212 (as shown in FIG. 4), and another targeting a particular material of the etch stop layer 212 and selected to resist etching the insulating material layer 210 (as shown in FIG. 5). After the trench 218 is formed, the patterned photoresist layer 216 is removed by wet stripping or plasma ashing. Alternatively, the patterned photoresist layer 216 may be removed after the etching of the sacrificial dielectric layer 214 and before the etching of the etch stop layer 212, where the etching of the etch stop layer 212 uses the patterned sacrificial dielectric layer 214 as an etch mask.

Referring to FIGS. 1A and 6-7, the method 100 at operation 108 forms dielectric fins 220 (sometimes called dummy fins or hybrid fins, in some instances) in the trenches 218. Each dielectric fin 220 may be disposed between the semiconductor fins 204 and oriented substantially parallel to the semiconductor fins 204. However, unlike the semiconductor fins 204 configured to provide active devices, the dielectric fins 220 are inactive and not configured to form FETs. In some embodiments, the dielectric fins 220 are provided to adjust fin-to-fin spacing (i.e., fin pitch). The dielectric fins 220 could also help to release fin patterning loading effect and prevent source/drain EPI bridge. The dielectric fins 220 may be formed by any suitable method. In one example as illustrated in FIG. 6, the dielectric material of the dielectric fins 220 may first be deposited filling the trenches 218 and covering the device 200. The dielectric fins 220 may include any suitable dielectric material including silicon carbide nitride, silicon carbide oxynitride, and metal oxide, such as hafnium oxide, zirconium oxide, and aluminum oxide, and/or other suitable dielectric materials, and may be deposited by any suitable deposition process including CVD, PVD, ALD, and/or other suitable processes. In an example, the dielectric fins 220 include aluminum oxide deposited by CVD. In various embodiments, the dielectric fins 220 include different material composition from that of either the sacrificial dielectric layer 214 or the etch stop layer 212. Following the deposition, a CMP process may be performed to remove excess dielectric material. In some embodiments, the hard mask layer 206 may function as a CMP stop layer. Thereafter, the dielectric material of the dielectric fins 220 are recessed (e.g., by a chemical etching process) such that its top surface is lower than a top surface of the semiconductor fins 204. Operation 108 may also recess the etch stop layer 212 and the sacrificial dielectric layer 214, as shown in FIG. 7. In the illustrated embodiment, after operation 108, the etch stop layer 212 and the sacrificial dielectric layer 214 only remain on one sidewall of a semiconductor fin 204 that faces away from an adjacent semiconductor fin 204. Also, due to the thicknesses of the etch stop layer 212 and the sacrificial dielectric layer 214, the bottom surfaces of various dielectric fins 220 are not even, such that the dielectric fins 220 formed directly on the insulating material layer 210 has a bottom surface lower than that of other dielectric fins 220 formed on the sacrificial dielectric layer 214.

Referring to FIGS. 1A and 8, the method 100 at operation 110 forms a capping layer 222 covering the dielectric fins 220, the etch stop layer 212 and the sacrificial dielectric layer 214. The capping layer 222 includes a dielectric material different from that of the sacrificial dielectric layer 214. In some embodiments, the dielectric material of the capping layer 222 is different from that of the etch stop layer 212 as well. In some alternative embodiments, the dielectric material of the capping layer 222 is the same as that of the etch stop layer 212. In a particular example, the capping layer 222 is made of high-k dielectric material, such as metal oxide (e.g., hafnium oxide, zirconium oxide, aluminum oxide, or a combination thereof). The capping layer 222 may be deposited by any suitable deposition process including CVD, PVD, ALD, and/or other suitable processes. Following the deposition, a CMP process may be performed to remove excess dielectric material. In the illustrated embodiment, the CMP process may also remove the hard mask layer 206 and expose a top surface of the semiconductor fins 204. A thickness of the capping layer 222 may be in a range from about 5 nm to about 20 nm.

Referring to FIGS. 1A and 9, the method 100 at operation 112 recesses the insulating material layer 210 so that upper portion of the semiconductor fins 204 are exposed. In some embodiments, the insulating material layer 210 may be recessed in a range from about 40 nm to about 80 nm. Operation 112 also recesses the liner layer 208. With this operation, the semiconductor fins 204 are electrically separated from each other by the recessed insulating material layer 210, which is also called a shallow trench isolation (STI). In many embodiments, the method 100 forms the STI 210 by a suitable etching process, such as a dry etching process, a wet etching process, or an RIE process.

Referring to FIGS. 1A, 10A-10B, and 11A-11B', the method 100 at operation 114 forms multiple dummy gate stacks 230 engaging the semiconductor fins 204. Particularly, FIG. 10A illustrates a three-dimensional view of the device 200 at operation 114; FIG. 10B illustrates a planar top view of the device 200; FIG. 11A illustrates a cross-sectional view of the device 200 taken along line A-A' as shown in FIGS. 10A-B (that is, Y-cut on fin 204); FIG. 11A' illustrates an alternative embodiment of the cross-sectional view in FIG. 11A; FIG. 11B illustrates a cross-sectional view of the device 200 taken along line B-B' as shown in FIGS. 10A-B (that is, X-cut in S/D regions); FIG. 11B' illustrates an alternative embodiment of the cross-sectional view in FIG. 11B.

Each dummy gate stack 230 serves as a placeholder for subsequently forming a high-k metal gate structure (HKMG). The dummy gate stack 230 may include a dummy gate electrode 232 and various other material layers. In some embodiments, the dummy gate electrode 232 includes polysilicon. In the depicted embodiment, referring to FIG. 11A, the dummy gate stack may include an interfacial layer 234 disposed between the semiconductor fins 204 and the dummy gate electrode 232, a hard mask layer 236 disposed over the dummy gate electrode 232, and/or a hard mask layer 238 disposed over the hard mask layer 236. The dummy gate stack 230 is formed by first blanket depositing the various material layers of the dummy gate stack. Various material layers of the dummy gate stack 230 may be formed by any suitable process, such as CVD, PVD, ALD, chemical oxidation, other suitable processes, or combinations thereof. Subsequently, a patterning operation is performed on the various material layers of the dummy gate stack 230 to form the dummy gate stack over the semiconductor fins 204. As will be discussed in detail below, portions of the dummy gate stack 230 are replaced with the HKMG during a gate replacement process after other components (e.g., the epitaxial S/D features) of the device 200 are fabricated. The hard mask layers 236 and 238 may each include any suitable dielectric material, such as a semiconductor oxide and/or a semiconductor nitride. In one example, the hard mask layer 236 includes silicon carbonitride, and the hard mask layer 238 includes silicon oxide. The interfacial layer 224 may include any suitable material, such as silicon oxide.

Still referring to FIGS. 11A and 11B, the method 100 at operation 114 also forms a dielectric layer 240 over the device 200. In many embodiments, the dielectric layer 240 is formed conformally over the device 200, including the semiconductor fins 204, the capping layer 222 above the dielectric fins 220, and the dummy gate stacks 230. The dielectric layer 240 may include any suitable dielectric material, such as a nitrogen-containing dielectric material, and may be formed by any suitable method, such as ALD, CVD, PVD, other suitable methods, or combinations thereof. In the illustrated embodiment, the dielectric layer 240 is formed by a thermal ALD process. In some examples, the dielectric layer 240 may include silicon nitride, silicon carbonitride, silicon oxycarbonitride, other suitable dielectric materials, or combinations thereof.

The method 100 at operation 114 also forms a gate spacer layer 242 over the dielectric layer 240. Similar to the dielectric layer 240, the gate spacer layer 242 may be formed conformally over the dummy gate stacks 230. The gate spacer layer 242 may include any suitable dielectric material, such as an oxygen-containing dielectric material or a high-k dielectric material, and may be formed by any suitable method, such as ALD, CVD, PVD, other suitable methods, or combinations thereof. In some embodiments, the gate spacer layer 242 includes two or more material layers, such as a first gate spacer layer 242a and a second gate spacer layer 242b deposited on the first gate spacer layer 242a. In a particular example, the first gate spacer layer 242a includes SiOCN, SIOC, SiOCN, or SiN, or combinations thereof, with a thickness from about 2 nm to about 4 nm; the second gate spacer layer 242b includes materials different from that of the first gate spacer layer 242a, such as SiCN, SiN, or combinations thereof, with a thickness from about 2 nm to about 4 nm.

Referring to FIG. 11A', an alternative embodiment of device 200 at operation 114 is illustrated. Many aspects of the device 200 in FIG. 11A' are substantially similar to those in FIG. 11A. One difference is that the semiconductor fin 204 in FIG. 11A' may include alternating layers of semiconductor materials, e.g., semiconductor material 204a and semiconductor material 204b that is different from the semiconductor material 204b. In some example embodiments, the semiconductor fin 204 may include a total of three to ten alternating layers of semiconductor materials; of course, the present disclosure is not limited to such configuration. In the present disclosure, the semiconductor material 204a includes Si, while the semiconductor material 204b includes SiGe. Either of the semiconductor materials 204a and 204b (or both) may be doped with a suitable dopant, such as a p-type dopant or an n-type dopant, for forming desired FETs. The semiconductor materials 204a and 204b may each be formed by an epitaxial process, such as, for example, a molecular beam epitaxy (MBE) process, a CVD process such as a metal organic CVD (MOCVD) process, and/or other suitable epitaxial growth processes.

Still referring to FIG. 11A', in many embodiments, alternating layers of the semiconductor materials 204a and 204b are configured to provide multi-gate devices such as GAA FETs, the details of forming which are provided below. Multi-gate devices have been introduced in an effort to improve gate control by increasing gate-channel coupling, reduce OFF-state current, and reduce short-channel effects. A multi-gate device such as a GAA FET generally includes a gate structure that extends around its horizontal channel region, providing access to the channel region on all sides. The GAA FETs are generally compatible with CMOS processes, allowing them to be aggressively scaled down while maintaining gate control and mitigating short-channel effects. Of course, the present disclosure is not limited to forming GAA FETs only and may provide other three-dimensional FETs such as FinFETs. As such, the semiconductor fin 204 may include a single layer of semiconductor material or multiple layers of different semiconductor materials not configured in an alternating stack, such that a uniform fin is provided to form a FinFET, as already depicted in association with FIG. 11A.

Referring to FIG. 11B', yet another alternative embodiment of device 200 at operation 114 is illustrated. Many aspects of the device 200 in FIG. 11B' are substantially similar to those in FIG. 11B. One difference is that the two illustrated semiconductor fins 204 in FIG. 11B' may include different semiconductor materials. For example, one semiconductor fin 204 may include Si for forming n-type FET, while the other semiconductor fin 204 may include SiGe for forming p-type FET. The forming of the semiconductor fin including SiGe may include recessing the Si fin and depositing SiGe by an epitaxial process, such as, for example, a molecular beam epitaxy (MBE) process, a CVD process such as a metal organic CVD (MOCVD) process, and/or other suitable epitaxial growth processes.

Figure 12B:
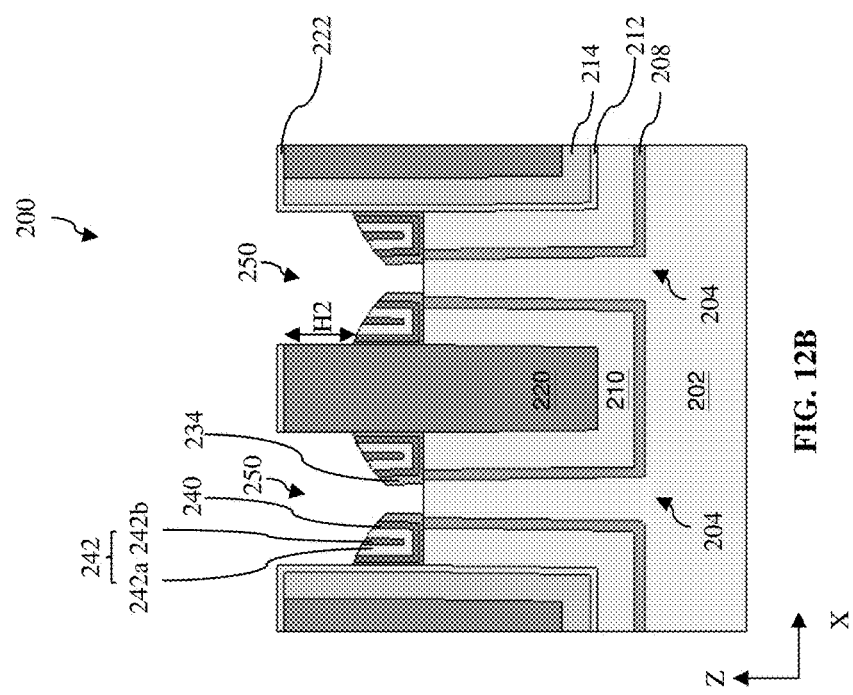
Figure 12A:
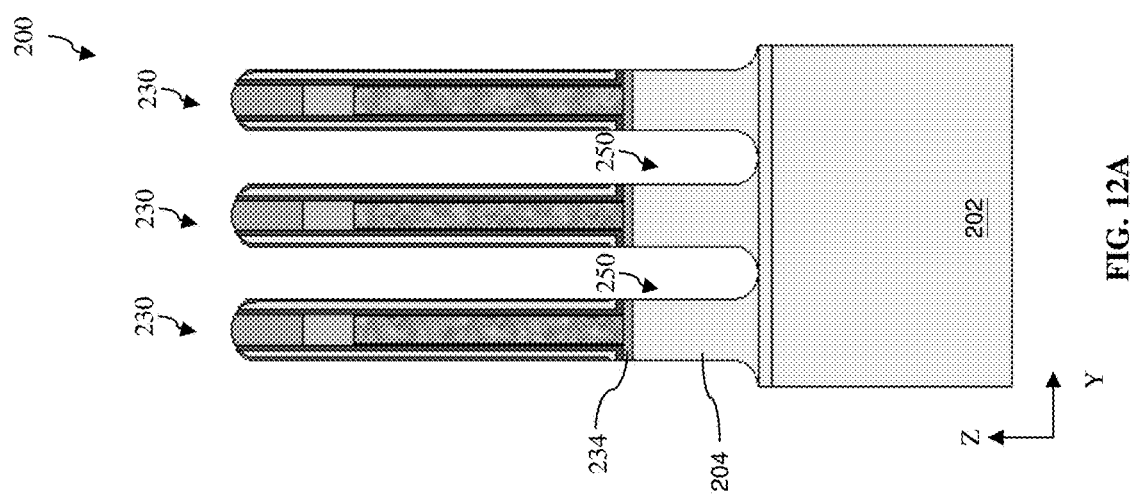

Referring to FIGS. 1A and 12A-12B, the method 100 at operation 116 removes a portion of the semiconductor fins 204 to form recesses 250 therein. In many embodiments, the method 100 forms the recess 250 by a suitable etching process, such as a dry etching process, a wet etching process, or an RIE process. In some embodiments, the method 100 selectively removes the semiconductor fins 204 without etching or substantially etching portions of the etch stop layer 212 and dielectric fin 220. As depicted herein, upper portions of the material layers 234, 240, and 242, as well as upper portions of the capping layer 222 formed over the dielectric fin 220 may be removed at operation 116 to form the recess 250. The etching process at operation 116 may implement a dry etching process using an etchant including a bromine-containing gas (e.g., HBr and/or $CHBR_3$), a fluorine-containing gas (e.g., $CF_4$, $SF_6$, $CH_2F_2$, $CHF_3$, and/or $C_2F_6$), other suitable gases, or combinations thereof. The extent of which the semiconductor fins 204 is removed may be controlled by adjusting the duration of the etching process. In some embodiments, the etching process at operation 116 exposes upper portions of the dielectric fin 220 for a height H2 equal to or less than about 40 nm. In some embodiments, a remaining thickness of the capping layer 222 is in a range of about 3 nm to about 10 nm.

Figures 13A, 13B:
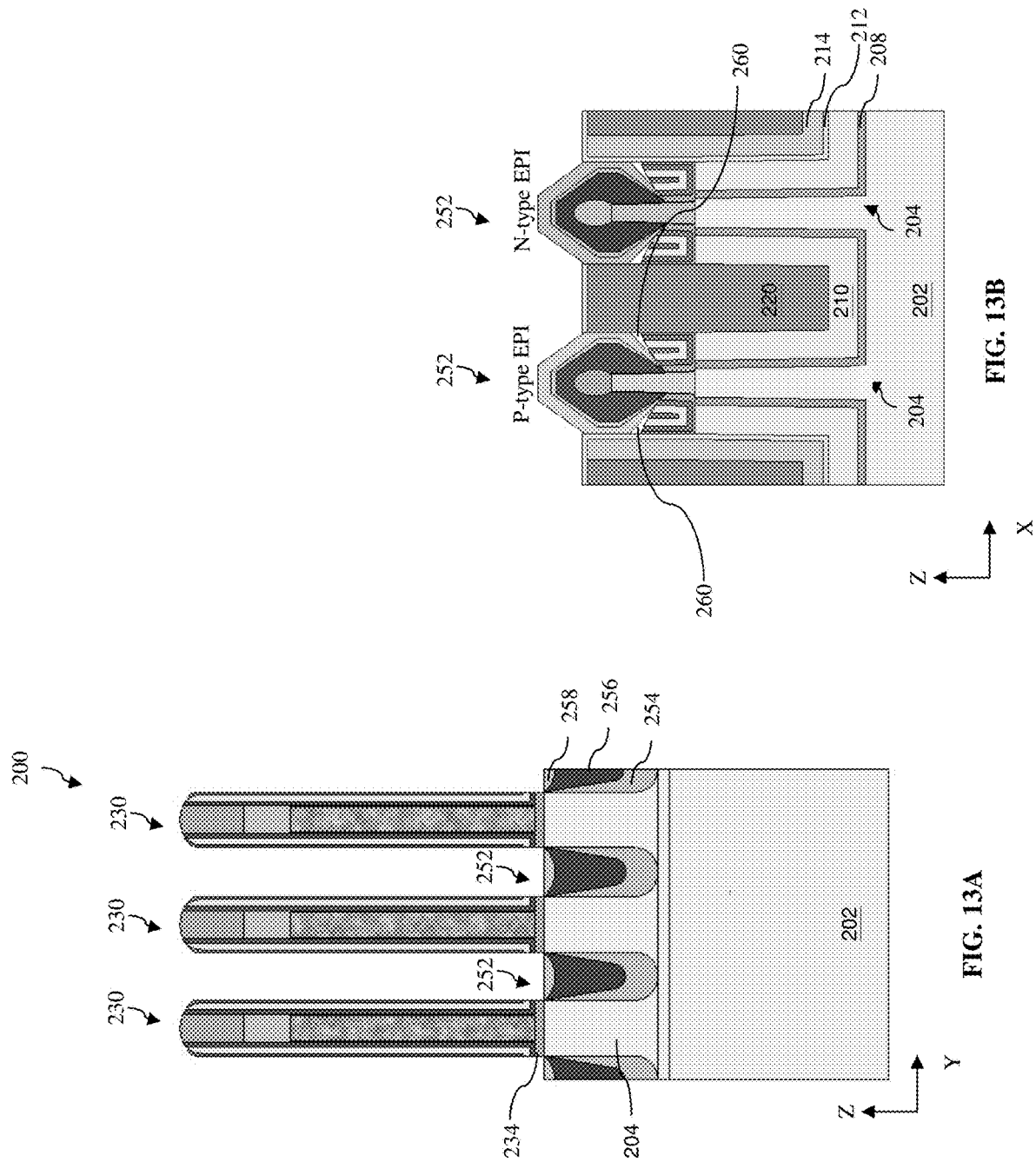

Referring to FIGS. 1B and 13A-13B, the method 100 at operation 118 grows an epitaxial S/D feature 252 starting from the recess 250. The epitaxial S/D feature 252 may include multiple epitaxial semiconductor layers, e.g., layers 254, 256, and 258. In some embodiments, the layers 254, 256, and 258 differ in amount of dopant included therein. In some examples, the amount of dopant included in the layer 254 is less than that included in the layer 258 due to the nature of the doping process. In some examples, the amount of dopant included in the layer 258 is also less than that included in the layer 256 to minimize potential leak currents. In some examples, the amount of dopant included in the layer 256 is about the same or higher than that included in the layer 254. Referring to FIG. 13B, the epitaxial S/D feature 252 initially grows in the recess 250 and then extends above the dielectric fins 220. In other words, the growth of the epitaxial S/D feature 252 is not laterally confined by the width of the recess 250, which allows the size of the epitaxial S/D feature 252 to be flexibly designed. In the illustrated embodiment, an air gap 260 remains on both sides of bottom portions of the epitaxial S/D feature 252 (e.g., between the epitaxial S/D feature 252 and its adjacent dielectric fin 220) after operation 118.

The epitaxial S/D feature 252 (i.e., the layers 254, 256, and 258 included therein) may be formed by any suitable method, such as MBE, MOCVD, other suitable epitaxial growth processes, or combinations thereof. The epitaxial S/D feature 252 may be suitable for a p-type FinFET device (e.g., a p-type epitaxial material) or alternatively, an n-type FinFET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopants. In the illustrated embodiment, a p-type epitaxial S/D feature 252 and an adjacent n-type epitaxial S/D feature 252 are depicted.

Figure 14B:
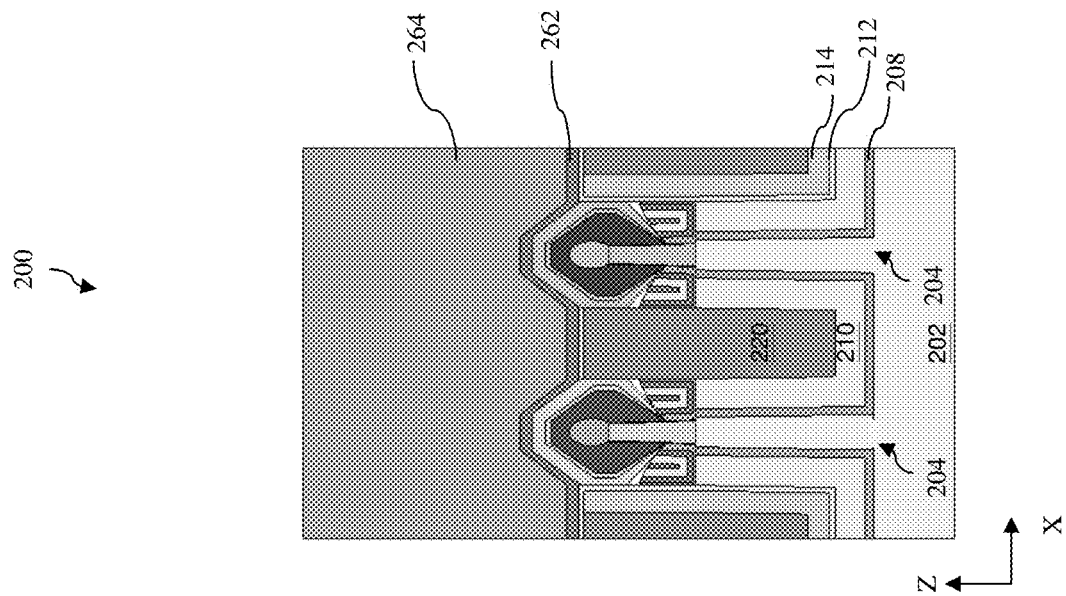
Figure 14A:
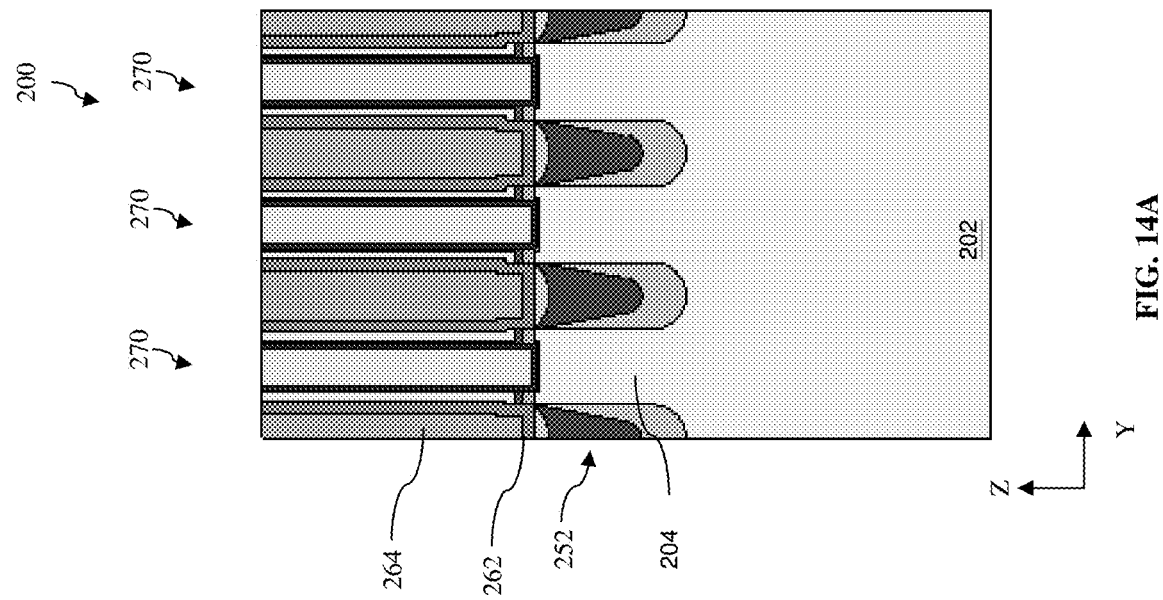

Referring to FIGS. 1B and 14A-14B, the method 100 at operation 120 forms an interlayer dielectric (ILD) layer 264 over a contact etch-stop layer (CESL) 262. The CESL 262 may include silicon nitride, silicon oxynitride, silicon nitride with oxygen or carbon elements, other suitable materials, or combinations thereof, and may be formed by CVD, PVD, ALD, other suitable methods, or combinations thereof. In some embodiments, the CESL 262 has a conformal profile on the dummy gate stacks 230 and on the epitaxial S/D features 252. The ILD layer 264 includes a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. The ILD layer 264 may include a multi-layer structure having multiple dielectric materials and may be formed by a deposition process such as, for example, CVD, flowable CVD (FCVD), spin-on-glass (SOG), other suitable methods, or combinations thereof. In some embodiments, forming the ILD layer 264 further includes performing a CMP process to planarize a top surface of the device 200, such that the top surfaces of the dummy gate stacks 230 are exposed.

Still referring to FIGS. 1B and 14A-14B, the method 100 at operation 122 performs a gate replacement process to replace the dummy gate stacks 230 with respective metal gate structures 270. In some embodiments, each metal gate structure 270 is a high-k metal gate structure (HKMG), where "high-k" indicates that the metal gate structure 270 includes a gate dielectric layer having a dielectric constant greater than that of silicon dioxide (about 3.9). The gate replacement process at operation 122 may be implemented in a series of fabrication steps as described in detail below.

The method 100 at operation 122 removes the dummy gate stacks 230 by any suitable method to form a gate trench (not depicted) over the semiconductor fins 204. Forming the gate trench may include one or more etching processes that are selective to the materials included in the dummy gate stacks 230 (e.g., polysilicon included in the dummy gate electrodes). The etching processes may include dry etching, wet etching, RIE, or other suitable etching methods, or combinations thereof. For embodiments in which a multi-gate device (e.g., a GAA FET) is desired, referring to FIG. 11A' for example, the semiconductor layers 204B (including SiGe) are selectively removed from the semiconductor fins 204 in an etching process, such that voids or gaps (not depicted) are formed between stacks of the semiconductor layers 204A (including Si). In some embodiments, the etching process may be a selective dry etching process or a wet etching process.

Then, the method 100 proceeds to forming the metal gate structure 270 in the gate trench. For embodiments in which the semiconductor fin 204 includes alternating stacks of the semiconductor materials 204a and 204b, various material layers of the metal gate structure 270 are also deposited in the gaps formed between the layers of the semiconductor material 204a when the semiconductor material 204b is removed from the device 200. Though not depicted, the metal gate structure 270 may include multiple material layers, such as a high-k gate dielectric layer formed over an interfacial layer, a work function metal layer formed over the high-k gate dielectric layer, a bulk conductive layer formed over the work function metal layer, other suitable layers, or combinations thereof. The high-k dielectric layer may include one or more high-k dielectric materials (or one or more layers of high-k dielectric materials), such as hafnium silicon oxide (HfSiO), hafnium oxide (HfO$_2$), alumina (Al$_2$O$_3$), zirconium oxide (ZrO$_2$), lanthanum oxide (La$_2$O$_3$), titanium oxide (TiO$_2$), yttrium oxide (Y$_2$O$_3$), strontium titanate (SrTiO$_3$), or a combination thereof. The work function metal layer may include any suitable material, such as titanium nitride (TiN), tantalum nitride (TaN), ruthenium (Ru), molybdenum (Mo), tungsten (W), platinum (Pt), titanium (Ti), aluminum (Al), tantalum carbide (TaC), tantalum carbide nitride (TaCN), tantalum silicon nitride (TaSiN), titanium silicon nitride (TiSiN), other suitable materials, or combinations thereof. In some embodiments, the work function metal layer includes multiple material layers of the same or different types (i.e., both n-type work function metal or both p-type work function metal) in order to achieve a desired threshold voltage. The bulk conductive layer may include aluminum (Al), copper (Cu), tungsten (W), cobalt (Co), ruthenium (Ru), other suitable conductive materials, or combinations thereof. The metal gate structure 270 may include other material layers, such as a barrier layer, a glue layer, and/or a capping layer. The various layers of the metal gate structure 270 may be formed by any suitable method, such as CVD, ALD, PVD, plating, chemical oxidation, thermal oxidation, other suitable methods, or combinations thereof. Thereafter, the method 100 may perform one or more polishing process (e.g., CMP) to remove any excess conductive materials and planarize the top surface of the device 200.

Referring to FIGS. 1B and 15A-15C, the method 100 also includes an operation 124 by performing a patterning process to form contact trenches (also referred to as contact holes) 276 in the ILD layer 264. The contact trenches 276 is offset from a center of the epitaxial S/D features 252, such that a top surface of the epitaxial S/D features 252 is partially exposed in the contact trenches 276. In the illustrated embodiment, a portion of the top surface of an epitaxial S/D feature 252 that is closer to an adjacent S/D feature 252 remains covered by the CESL 262 and the ILD layer 264. The formation of the contact trenches 276 includes forming a patterned resist layer by a lithography process with openings that define regions for contact trenches 276; etching the ILD layer 264 and CESL 262 through the openings of the patterned resist layer; and removing the patterned resist layer by wet stripping or plasma ashing. A hard mask may be additionally employed to patterning the contact trenches 276. The contact trenches 276 also exposes the capping layer 222 and the etch stop layer 21 therein.

Figure 15B:
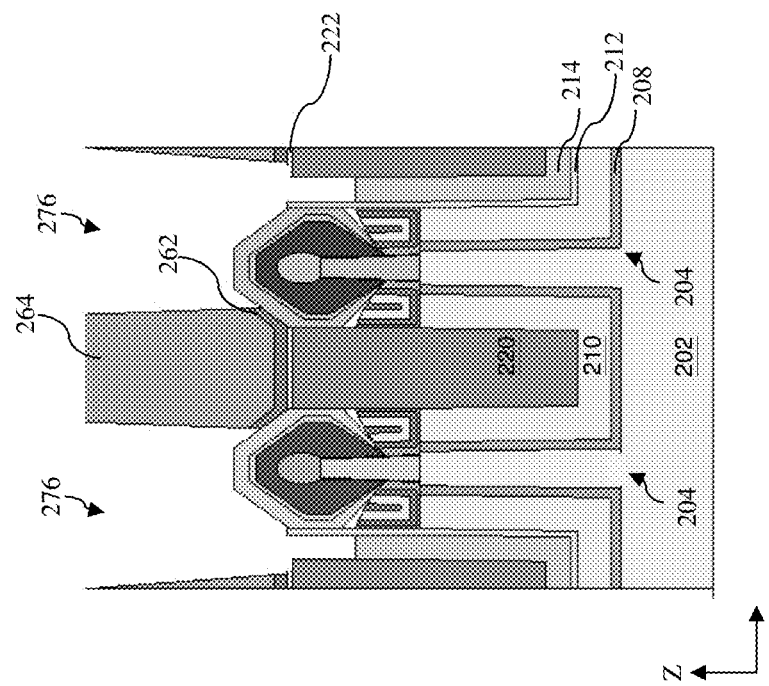
Figure 15A:
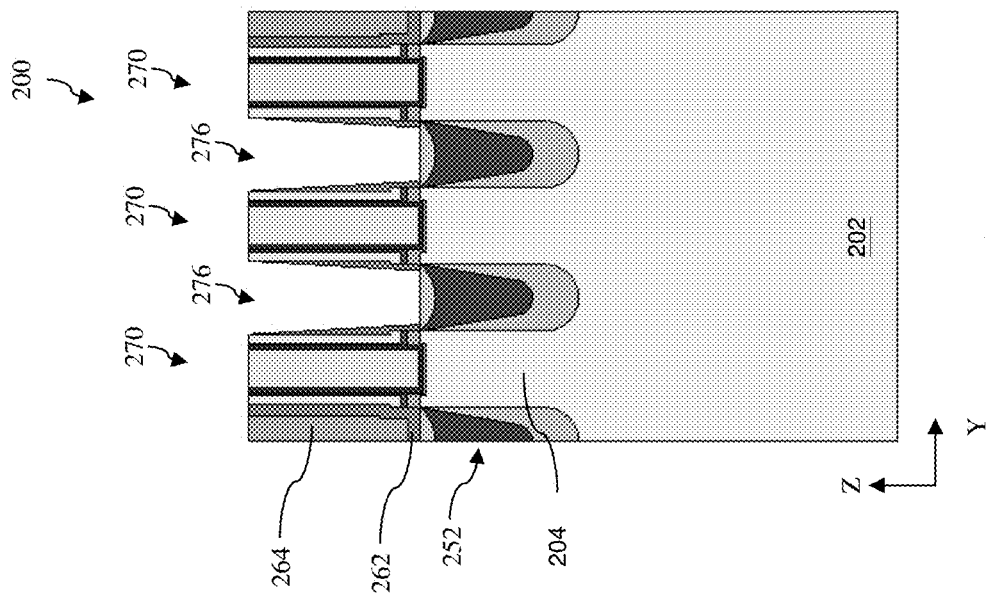

Still referring to FIGS. 1B and 15A-15B, the method 100 at operation 126 performs one or more selective etching processes to remove a portion of the capping layer 222 exposed in the contact trenches 276 and recess the previously-formed sacrificial dielectric layer 214 through the openings in the capping layer 222. In some examples, the etching process may be one or more isotropic etching processes (e.g., isotropic dry etching or isotropic wet etching process) that implements an etchant that includes hydrofluoric acid (HF), ammonia (NH$_3$), nitrogen trifluoride (NF$_3$), other suitable etchants, or combinations thereof. The extent of which the sacrificial dielectric layer 214 is recessed may be controlled by adjusting the duration of the etching process. In some embodiments, the etching process at operation 126 recesses the sacrificial dielectric layer 214 for a depth from about 10 nm to about 60 nm. The etching process recesses the sacrificial dielectric layer 214 without etching or substantially etching the etch stop layer 212. The etch stop layer 212 protects sidewalls of the epitaxial S/D features 252 from excessive etches during the etching process.

Figure 16B:
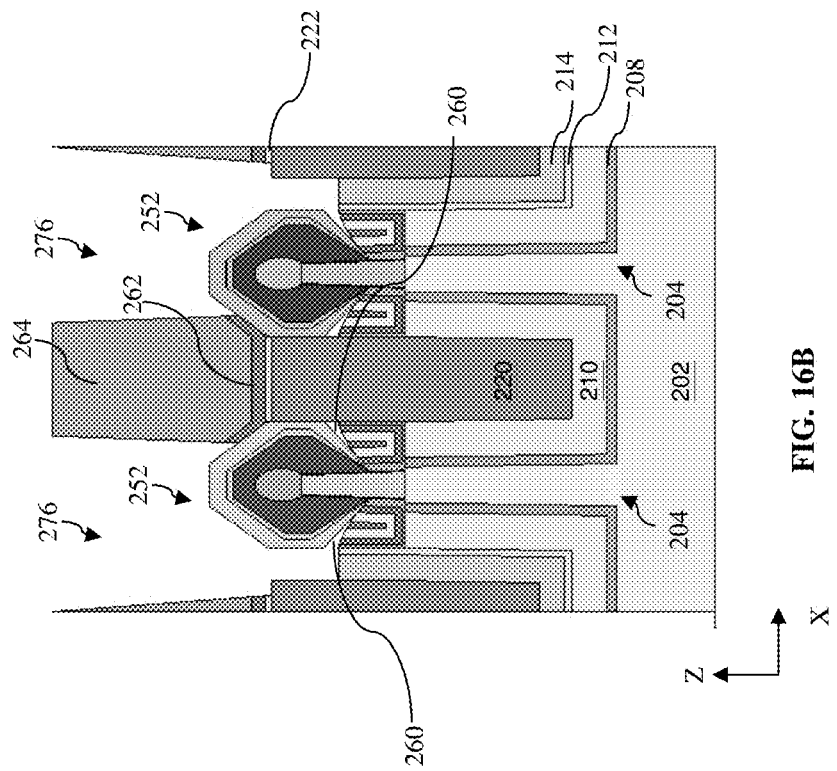
Figure 16A:
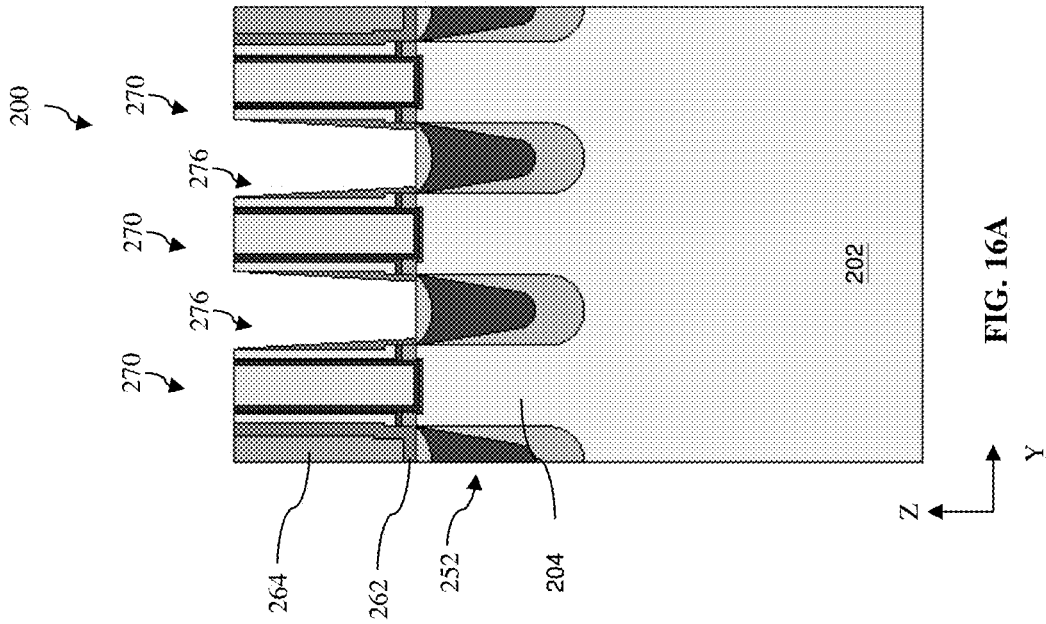

Referring to FIGS. 1B and 16A-16B, the method 100 at operation 128 performs a selective etching process to recess the etch stop layer 212, thereby exposing a sidewall surface of the epitaxial S/D features 252. The etching process may include any suitable etching technique such as wet etching, dry etching, RIE, ashing, and/or other etching methods. The etchant is selected that it etches the etch stop layer 212 without etching or substantially etching the sacrificial dielectric layer 214 and the epitaxial S/D features 252. The extent of which the etch stop layer 212 is recessed may be controlled by adjusting the duration of the etching process. Therefore, depending on the duration of the etching process, the top surface of the etch stop layer 212 and the sacrificial dielectric layer 214 may be substantially level in some embodiments. In some other embodiments, the top surface of the etch stop layer 212 may be higher than that of the sacrificial dielectric layer 214. In yet some other embodiments, the top surface of the etch stop layer 212 may be lower than that of the sacrificial dielectric layer 214. The sacrificial dielectric layer 214 and the etch stop layer 212 are collectively configured to reserve a well-defined contact trench width which is defined by the total thickness of the sacrificial dielectric layer 214 and the etch stop layer 212. The position of the contact trench 276 is also determined by self-alignment. Note that the air gap 260 on the exposed sidewall side of the epitaxial S/D features 252 is also exposed in the contact trench 276. As a comparison, the air gap 260 on the opposing sidewall remains between the epitaxial S/D features 252 and the dielectric fin 220.

Figure 17B:
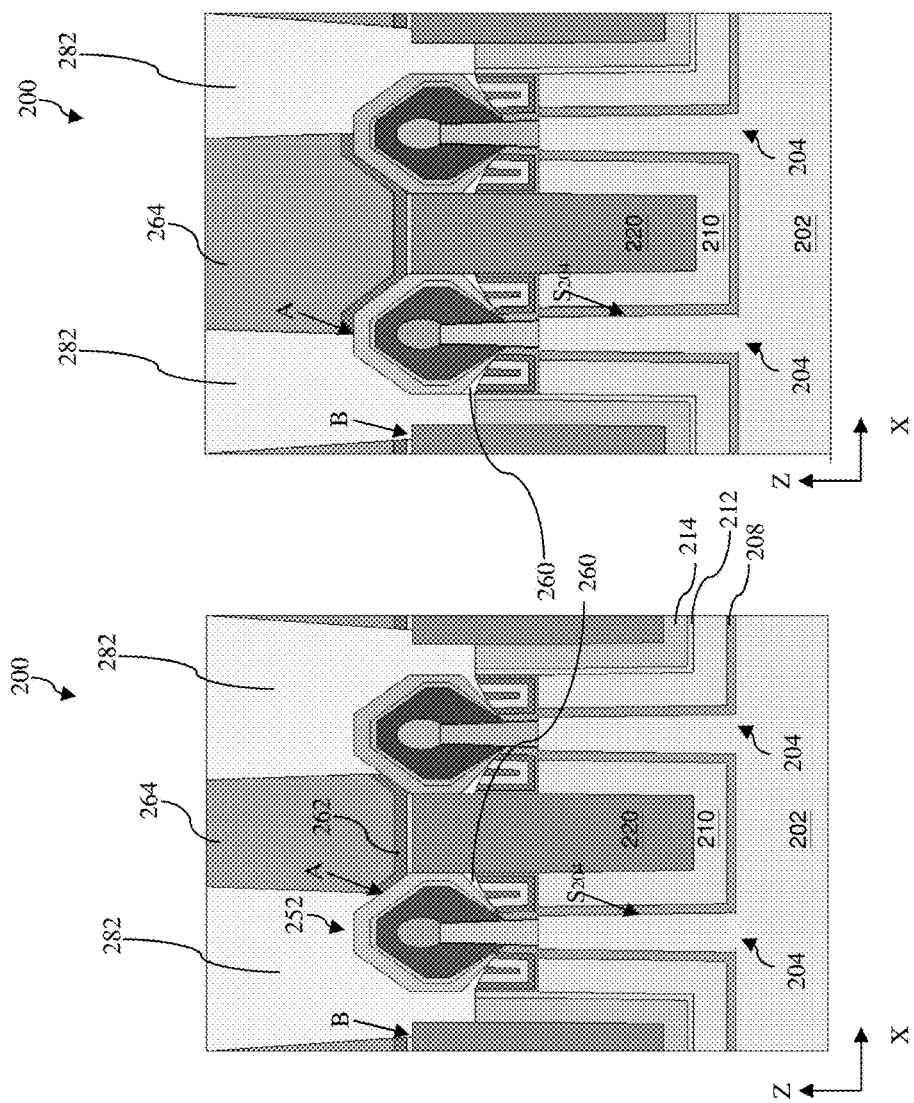
Figure 17A:
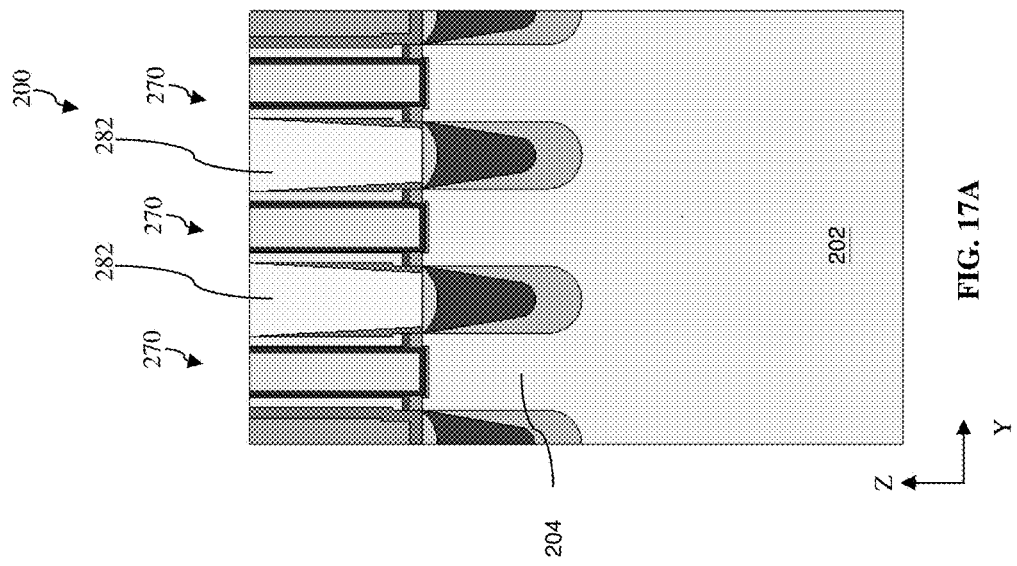

Referring to FIGS. 1B and 17A-17B', the method 100 at operation 130 forms S/D contacts 282 in the contact trenches 276 to be in electrical contact with corresponding epitaxial S/D features 252. The method 100 at operation 130 may form silicide features (not shown) over the exposed surfaces of the epitaxial S/D features 252 before depositing the conductive material of the S/D contacts 282. In some embodiments, the silicide features are formed by silicidation such as self-aligned silicide in which a metal material is formed over the epitaxial S/D features 252, then the temperature is raised to anneal and cause reaction between underlying silicon and the metal to form silicide, and unreacted metal is etched away. The silicide features help reducing S/D contact resistance. Each S/D contact 282 may include one or more conductive layers and may be formed using any suitable methods such as ALD, CVD, PVD, plating, and/or other suitable processes. In some embodiments, each S/D contact 282 includes a seed metal layer and a fill metal layer. In various embodiments, the seed metal layer includes cobalt (Co), tungsten (W), ruthenium (Ru), nickel (Ni), other suitable metals, or combinations thereof. The fill metal layer may include copper (Cu), tungsten (W), aluminum (Al), cobalt (Co), other suitable materials, or combinations thereof.

Note that in FIG. 17B, the conductive material of the S/D contacts 282 fills into the air gap 260 that exposes in the contact trenches 276, such that the S/D contacts 282 substantially fully wraps one sidewall of the epitaxial S/D features 252. The other sidewall of the epitaxial S/D features 252 that faces the adjacent epitaxial S/D feature 252 is not wrapped by the S/D contacts 282, which helps improving electric break down performance between adjacent S/D contacts. Due to the large surface area of the epitaxial S/D features 252 exposed in the contact trenches 276, particularly one sidewall surface of the epitaxial S/D features 252, the S/D contacts 282 still has a sufficiently large interface with the epitaxial S/D features 252 for reducing S/D contact resistance.

In the illustrated embodiment in FIG. 17B, the two sidewalls of the S/D contact 282 intersect the epitaxial S/D feature 252 at a landing point A and a top surface of the dielectric fin 220 at a landing point B, respectively. The landing point A may be offset from the sidewall $S_{204}$ of the semiconductor fin 204 in a direction towards the adjacent semiconductor fin 204, such that the semiconductor fin 204 is fully directly under the S/D contact 282, even though a top surface of the epitaxial S/D features 252 is only partially covered by the S/D contact 282. An alternative embodiment is illustrated in FIG. 17B', where the landing point A may be offset from the sidewall $S_{204}$ of the semiconductor fin 204 in a direction away from the adjacent semiconductor fin 204, such that only a portion of the semiconductor fin 204 is directly under the S/D contact 282. In this way, the distance between adjacent S/D contacts may further increase, such as in a range larger than about 10 nm, which helps improving electric break down performance. In a particular example, the lateral position of the landing point A is about in a center line of the epitaxial S/D feature 252. In yet another case, the landing point A may be further offset such that neither portion of the semiconductor fin 204 is directly under the S/D contact 282 and the S/D contact 282 mainly contacts with the sidewall of the epitaxial S/D feature 252. Yet another difference in the illustrated embodiment in FIG. 17B' is that both air gaps 260 on opposing sidewalls of the epitaxial S/D feature 252 remain. Especially when the contact trench has a high aspect ratio, the conductive material of the S/D contacts 282 may be difficult to fill in the air gap 260. Nonetheless, by finely defining a width of the contact trenches, voids can be avoided on the interface between the S/D contacts 282 and the sidewall of the epitaxial S/D features 252, which helps reducing contact resistance.

Referring to FIG. 1B, the method 100 at operation 132 may perform additional processing steps. For example, additional vertical interconnect features such as vias, horizontal interconnect features such as lines, and/or multilayer interconnect features such as metal layers and interlayer dielectrics can be formed over the device 200. The various interconnect features may implement various conductive materials including copper (Cu), tungsten (W), cobalt (Co), aluminum (Al), titanium (Ti), tantalum (Ta), platinum (Pt), molybdenum (Mo), silver (Ag), gold (Au), manganese (Mn), zirconium (Zr), ruthenium (Ru), their respective alloys, metal silicides, other suitable materials, or combinations thereof. The metal silicides may include nickel silicide, cobalt silicide, tungsten silicide, tantalum silicide, titanium silicide, platinum silicide, erbium silicide, palladium silicide, other suitable metal silicides, or combinations thereof.

Although not intended to be limiting, one or more embodiments of the present disclosure provide many benefits to a semiconductor device and the formation thereof. The present disclosure provides methods of forming an S/D contact that partially wraps an epitaxial S/D feature. Embodiments of the present disclosure includes forming, after the gate replacement process, an S/D contact that has contacting interface with one sidewall and a portion of the top surface of the epitaxial S/D feature. Accordingly, the half-wrapping configuration reduces contact resistance between underlying epitaxial S/D features and overlying S/D contacts.

In one example aspect, the present disclosure provides a method of semiconductor fabrication. The method includes forming a fin protruding from a substrate, the fin having a first sidewall and a second sidewall opposing the first sidewall; forming a sacrificial dielectric layer on the first and second sidewalls and a top surface of the fin; etching the sacrificial dielectric layer to remove the sacrificial dielectric layer from the second sidewall of the fin; forming a recess in the fin; growing an epitaxial source/drain (S/D) feature from the recess, the epitaxial S/D feature having a first sidewall and a second sidewall opposing the first sidewall, wherein the sacrificial dielectric layer covers the first sidewall of the epitaxial S/D feature; recessing the sacrificial dielectric layer, thereby exposing the first sidewall of the epitaxial S/D feature; and forming an S/D contact on the first sidewall of the epitaxial S/D feature. In some embodiments, the method further includes forming an etch stop layer between the sacrificial dielectric layer and the first sidewall of the fin, where the recessing of the sacrificial dielectric layer includes recessing the etch stop layer. In some embodiments, the etch stop layer is in physical contact with the first sidewall of the epitaxial S/D feature. In some embodiments, the S/D contact is free of physical contact with the second sidewall of the epitaxial S/D feature. In some embodiments, the S/D contact partially covers a top surface of the epitaxial S/D feature. In some embodiments, the method further includes forming an interlayer dielectric layer (ILD) covering the sacrificial dielectric layer and the epitaxial S/D feature and patterning the ILD to form a contact hole to expose the sacrificial dielectric layer. In some embodiments, the contact hole partially exposes a top surface of the epitaxial S/D feature. In some embodiments, the method further includes after the etching of the sacrificial dielectric layer, forming a dielectric fin on the second sidewall of the fin. In some embodiments, the dielectric fin is in physical contact with the second sidewall of the epitaxial S/D feature. In some embodiments, the dielectric fin is free of physical contact with the S/D contact.

In another example aspect, the present disclosure provides a method of semiconductor fabrication. The method includes forming first and second semiconductor fins protruding from a substrate; forming a first dielectric layer conformally covering the first and second semiconductor fins and the substrate; removing a first portion of the first dielectric layer from a region between the first and second semiconductor fins; depositing a second dielectric layer in the region between the first and second semiconductor fins; growing epitaxial source/drain (S/D) features on the first and second semiconductor fins, wherein each of the epitaxial S/D features has a first sidewall covered by the first dielectric layer and a second sidewall covered by the second dielectric layer; removing a second portion of the first dielectric layer from the first sidewall, thereby exposing the first sidewall; and forming a metal contact on the first sidewall. In some embodiments, the method further includes prior to the forming of the first dielectric layer, forming a third dielectric layer conformally covering the first and second semiconductor fins and the substrate, where the first dielectric layer covers the third dielectric layer. In some embodiments, the removing of the first portion of the first dielectric layer includes removing a first portion of the third dielectric layer from the region between the first and second semiconductor fins, and wherein the removing of the second portion of the first dielectric layer includes removing a second portion of the third dielectric layer from the first sidewall. In some embodiments, the first and third dielectric layers include different material compositions. In some embodiments, the method further includes recessing the first and second dielectric layers; forming a capping layer covering the first and second dielectric layers; and prior to the removing of the second portion of the first dielectric layer, partially removing the capping layer, thereby exposing the first dielectric layer.

In yet another example aspect, the present disclosure provides a method that includes a semiconductor device. The semiconductor device includes a semiconductor fin over a substrate; first and second dielectric layers over the substrate and sandwiching the semiconductor fin, wherein the first and second dielectric layers have different material compositions; an epitaxial source/drain (S/D) feature disposed over the semiconductor fin, wherein an extended portion of the epitaxial S/D feature extends over the first and second dielectric layers; and an S/D contact disposed on the epitaxial S/D feature, wherein the S/D contact partially covers a top surface of the epitaxial S/D feature and extends continuously to wrap a sidewall of the epitaxial S/D feature that faces the first dielectric layer. In some embodiments, a top surface of the first dielectric layer is lower than a top surface of the second dielectric layer. In some embodiments, the semiconductor device further includes a third dielectric layer, the first dielectric layer and the semiconductor fin sandwiching the third dielectric layer, where the first and third dielectric layers have different material compositions. In some embodiments, a top surface of the first dielectric layer is lower than a top surface of the third dielectric layer. In some embodiments, the semiconductor device further includes an air gap stacked between the epitaxial S/D feature and the second dielectric layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of semiconductor fabrication, comprising:
   forming a fin protruding from a substrate, the fin having a first sidewall and a second sidewall opposing the first sidewall;
   forming a sacrificial dielectric layer on the first and second sidewalls and a top surface of the fin;
   etching the sacrificial dielectric layer to remove the sacrificial dielectric layer from the second sidewall of the fin;
   forming a recess in the fin;
   growing an epitaxial source/drain (S/D) feature from the recess, the epitaxial S/D feature having a first sidewall and a second sidewall opposing the first sidewall, wherein the sacrificial dielectric layer covers the first sidewall of the epitaxial S/D feature;
   recessing the sacrificial dielectric layer, thereby exposing the first sidewall of the epitaxial S/D feature; and
   forming an S/D contact on the first sidewall of the epitaxial S/D feature.

2. The method of claim 1, further comprising:
   forming an etch stop layer between the sacrificial dielectric layer and the first sidewall of the fin,
   wherein the recessing of the sacrificial dielectric layer includes recessing the etch stop layer.

3. The method of claim 2, wherein the etch stop layer is in physical contact with the first sidewall of the epitaxial S/D feature.

4. The method of claim 1, wherein the S/D contact is free of physical contact with the second sidewall of the epitaxial S/D feature.

5. The method of claim 1, wherein the S/D contact partially covers a top surface of the epitaxial S/D feature.

6. The method of claim 1, further comprising:
   forming an interlayer dielectric layer (ILD) covering the sacrificial dielectric layer and the epitaxial S/D feature; and
   patterning the ILD to form a contact hole to expose the sacrificial dielectric layer.

7. The method of claim 6, wherein the contact hole partially exposes a top surface of the epitaxial S/D feature.

8. The method of claim 1, further comprising:
after the etching of the sacrificial dielectric layer, forming a dielectric fin on the second sidewall of the fin.

9. The method of claim 8, wherein the dielectric fin is in physical contact with the second sidewall of the epitaxial S/D feature.

10. The method of claim 8, wherein the dielectric fin is free of physical contact with the S/D contact.

11. A method, comprising:
forming first and second semiconductor fins protruding from a substrate;
forming a first dielectric layer conformally covering the first and second semiconductor fins and the substrate;
removing a first portion of the first dielectric layer from a region between the first and second semiconductor fins;
depositing a second dielectric layer in the region between the first and second semiconductor fins;
growing epitaxial source/drain (S/D) features on the first and second semiconductor fins, wherein each of the epitaxial S/D features has a first sidewall covered by the first dielectric layer and a second sidewall covered by the second dielectric layer;
removing a second portion of the first dielectric layer from the first sidewall, thereby exposing the first sidewall; and
forming a metal contact on the first sidewall.

12. The method of claim 11, further comprising:
prior to the forming of the first dielectric layer, forming a third dielectric layer conformally covering the first and second semiconductor fins and the substrate,
wherein the first dielectric layer covers the third dielectric layer.

13. The method of claim 12, wherein the removing of the first portion of the first dielectric layer includes removing a first portion of the third dielectric layer from the region between the first and second semiconductor fins, and wherein the removing of the second portion of the first dielectric layer includes removing a second portion of the third dielectric layer from the first sidewall.

14. The method of claim 12, wherein the first and third dielectric layers include different material compositions.

15. The method of claim 11, further comprising:
recessing the first and second dielectric layers;
forming a capping layer covering the first and second dielectric layers; and
prior to the removing of the second portion of the first dielectric layer, partially removing the capping layer, thereby exposing the first dielectric layer.

16. A method, comprising:
forming a semiconductor fin protruding from a substrate and through an isolation feature;
forming a first dielectric fin and a second dielectric fin sandwiching the semiconductor fin;
forming a sacrificial layer sandwiched between the first dielectric fin and the semiconductor fin;
forming an epitaxial feature over the semiconductor fin, wherein the epitaxial feature is sandwiched between the sacrificial layer and the second dielectric fin;
recessing the sacrificial layer, wherein, after the recessing of the sacrificial layer, a first sidewall of the epitaxial feature is exposed, wherein the epitaxial feature has a second sidewall opposing the first sidewall and in physical contact with the second dielectric fin; and
forming a conductive feature over the epitaxial feature and in physical contact with the first sidewall.

17. The method of claim 16, further comprising:
forming an etch stop layer sandwiched between the sacrificial layer and the semiconductor fin, wherein the etch stop layer is in physical contact with the first sidewall.

18. The method of claim 17, further comprising:
recessing the etch stop layer after the recessing of the sacrificial layer.

19. The method of claim 16, wherein the forming of the epitaxial feature traps an air gap between the epitaxial feature and the isolation feature, and wherein the forming of the conductive feature fills the air gap.

20. The method of claim 16, wherein the first dielectric fin and the second dielectric fin are embedded in the isolation feature.

* * * * *